United States Patent

Pecukonis

Patent Number: 4,531,101
Date of Patent: Jul. 23, 1985

[54] HIGH-FREQUENCY AMPLIFIER WITH ENHANCED GAIN FROM USE OF THE MILLER EFFECT CAPACITANCE

[75] Inventor: Joseph P. Pecukonis, Littleton, Colo.

[73] Assignee: Pasar, Inc., Denver, Colo.

[21] Appl. No.: 643,672

[22] Filed: Aug. 22, 1984

[51] Int. Cl.³ .............................................. H03F 3/04
[52] U.S. Cl. .................................... 330/302; 330/307; 330/188
[58] Field of Search ............... 330/165, 188, 267, 273, 330/302, 307

[56] References Cited

U.S. PATENT DOCUMENTS 3,699,466 10/1972 Uchiyama ........................... 330/273

Primary Examiner—James B. Mullins
Assistant Examiner—G. Wan
Attorney, Agent, or Firm—John R. Ley

[57] ABSTRACT

The Miller effect capacitance of an amplifying device, such as a transistor, is effectively used to increase the gain and/or the high-frequency cut-off point in the band width of a relatively high-frequency amplifier. The transistor or equivalent amplifying device is connected in an emitter follower configuration and the amplifier output signal is derived therefrom. An input signal to the amplifier is applied through an input transformer. The secondary winding of the input transformer is electrically connected to the base of the transistor. The emitter follower configuration of the transistor causes the Miller effect capacitance to be effective in a resonant circuit which includes the effective inductance of the secondary winding of the input transformer and the Miller effect capacitance. The overall amplifier gain is established primary by the ratio of the number of coil turns of the secondary winding to the number of coil turns of the primary winding of the input inductor multiplied by the "Q" of the resonant circuit including the secondary winding and the Miller effect capacitance.

19 Claims, 3 Drawing Figures

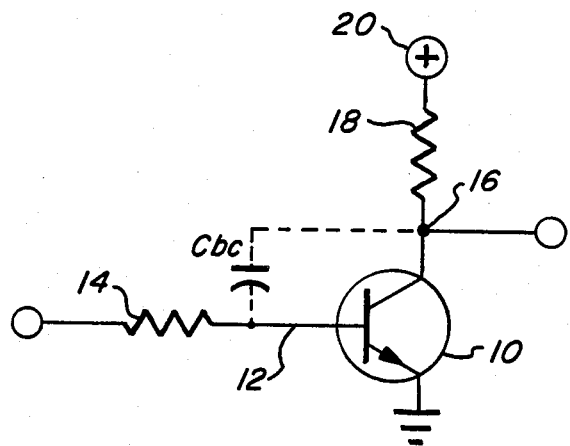
Fig_1
PRIOR ART
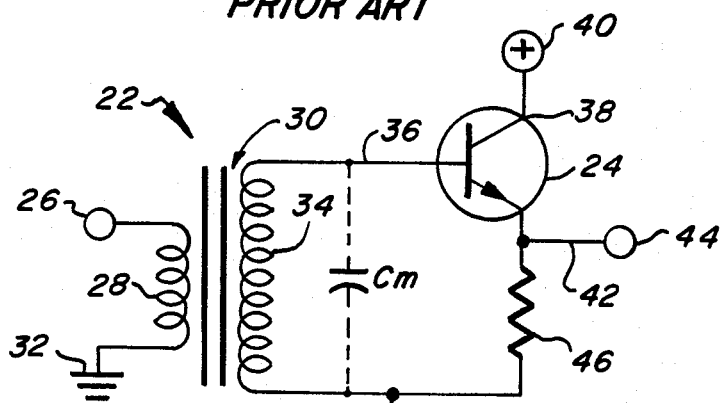
Fig_2
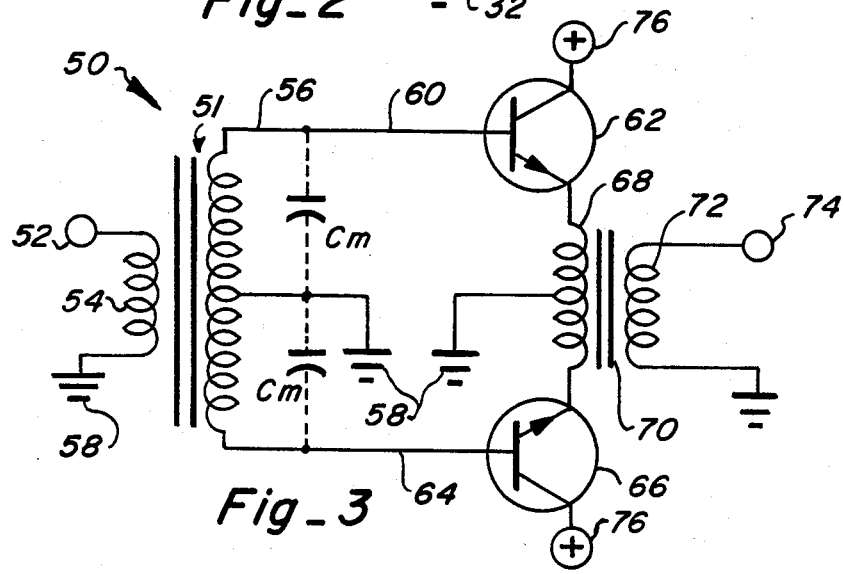
Fig_3

HIGH-FREQUENCY AMPLIFIER WITH ENHANCED GAIN FROM USE OF THE MILLER EFFECT CAPACITANCE

This invention pertains to a high-gain high-frequency amplifier where the Miller effect capacitance of the active amplifying device is advantageously used to enhance the high-frequency response while maintaining or increasing the gain, or to enhance the gain while maintaining or increasing the high-frequency cut-off point.

It has long been recognized that the inherent and stray internal capacitance between the collector and base of a bipolar transistor, the gate and drain of a field effect transistor, or the grid and cathode of a vacuum tube, is magnified in effective value by an amount approximately equal to the gain of the amplifying device. This magnified capacitance is known as the Miller effect capacitance, and it has serious deleterious effects on the high-frequency cut-off point and/or the gain of a high-frequency amplifier.

The Miller effect can be understood by reference to FIG. 1 of the drawings. A conventional bipolar transistor 10 is connected in a common emitter amplifying configuration with its base terminal 12 receiving an input signal through resistor 14. A collector terminal 16 of the transistor 10 is connected through the load resistor 18 to the voltage supply 20. The amplified output signal is presented at the collector terminal 16. The inherent base-to-collector capacitance is represented by the capacitor Cbc inherently connected (shown by dashed lines) between the base and collector terminals 12 and 16, respectively. Because of the gain of the transistor 10, the current conducted at the collector terminal 16 is approximately equal to the input current to the base terminal multiplied by the gain (A) of the transistor 10. There is also a phase reversal between the input signal and the amplified output signal, so the voltage between the base and collector and across the capacitor Cbc is in a series adding relationship. As a consequence, the current flow in capacitance Cbc during amplification by the transistor 10 is greater, because of the current amplification and the phase reversal, and this effect makes the effective value of Cbc appear much larger or magnified than it actually is. The magnified or effective value of Cbc becomes approximately the gain of transistor 10 multiplied by the value of Cbc. This magnification is known as the Miller effect and the magnified value of the capacitance Cbc is known as the Miller effect capacitance.

Many prior electronic circuits and devices actually make favorable use of the Miller effect capacitance, usually to delay response parameters. However, in high-frequency linear amplifiers, the Miller capacitance creates serious detrimental consequences which heretofore have only been partially avoided and then only usually through the sacrifice of gain in the amplifier. The primary detrimental effect is that the Miller capacitance severely reduces the high-frequency cut-off frequency of the amplifier frequency band width. For example and referring to FIG. 1, if the value of resistor 14 is 50 ohms and the capacitance Cbc by itself is ten picofarads (a typical value for a bipolar power transistor and substantially less than the typical value for a VMOS power transistor), the three dB high-frequency cut-off point of the circuit is approximately one hundred forty-seven megahertz when the voltage gain of the transistor is one, is approximately twenty-nine megahertz when the gain is ten, is approximately six megahertz when the voltage gain is fifty, and is approximately three megahertz when the voltage gain is one hundred. It is apparent that high-frequency amplifiers can only maintain the upper limits of high-frequency band width by reducing the gain. In fact, the gain of a conventional high-frequency amplifier stage is typically not greater than three. It is a substantial problem to obtain relatively high gain from a high-frequency amplifier.

Another problem associated with the Miller effect capacitance is that it couples the input to the output of the amplifying device in a feedback arrangement known as Miller feedback, as shown in FIG. 1. The Miller effect capacitance introduces a reactive element between the input and the output and this reactive capacitance can cause the amplifier to oscillate. Of course as an oscillator, the device is ineffective as an amplifier. If the input or the output circuits are tuned circuits, the uncertain effect of the Miller effect capacitance and feedback can change the preselected harmonic frequency of the tuned circuits. It becomes difficult to align the amplifier to provide a smooth symmetrical response centered about the resonant frequency of the input or output tuned circuits. Instead, distortions and additional harmonic components are introduced in the signals from the Miller effect capacitance and feedback.

BRIEF SUMMARY OF THE INVENTION

The present invention teaches a technique of favorably utilizing the Miller effect capacitance in a high-frequency amplifier to obtain relatively high gain while not seriously degrading the high-frequency cut-off point of the band width of the amplifier, or to increase the high-frequency cut-off point while maintaining the gain. The present invention also teaches a technique of avoiding the significant problems of Miller effect capacitive feedback which couples the input and the output circuits of the amplifier.

In accordance with the major aspects of the present invention, a transistor or its equivalent is connected in an emitter follower or voltage follower configuration to an input inductor means in the preferred form of an input transformer. In accordance with emitter follower or voltage follower configuration, a load is electrically connected to the emitter terminal and a power supply is electrically connected to the collector terminal. The base terminal of the transistor is connected to a secondary winding of the input inductor and signals at the secondary winding are applied to the base terminal of the transistor. An input signal for the amplifier is applied to the primary winding of the input inductor. The amplifier output signal is derived from the load connected to the emitter terminal. In this circuit configuration, the Miller effect capacitance becomes effective as part of a resonant circuit with the effective inductance of the secondary winding of the input inductor. The voltage follower configuration provides a high input impedance to the transistor from the resonant circuit to prevent excessive damping. The gain of the amplifier is primarily established by the ratio of the coil turns of the secondary winding to the coil turns of the primary winding of the input inductor multiplied by the square root of the "Q" of the resonant circuit including the effective inductance of the secondary winding and the Miller effect capacitance. Because the Miller effect capacitance becomes a part of a resonant circuit, amplification is contributed by the creation and enhancement of the "Q" of the input circuit, and the emitter follower configuration does not degrade the gain achieved.

The amplifier can also be arranged in a push-pull configuration by using a center tapped secondary winding on the input inductor and connecting a primary center tapped winding of an output inductor between the emitter terminals of two transistors in the push-pull circuit. The Miller effect capacitance of both transistors is thereby effectively connected in the resonant circuit including the input inductor. In the push-pull circuit configuration, the voltage on the two respective base terminals changes in unison and in correspondingly opposite directions with respect to the circuit reference potential. Since the Miller effect capacitance is dependent on the voltage between the collector and base terminals, the Miller effect capacitance associated with one of the transistors changes in an equal and opposite amount compared to the change in the Miller effect capacitance of the other transistor. The net result is that the total Miller effect capacitance available from both transistors is maintained approximately equal. Variations in the resonant frequency of the resonant circuit are thus reduced or eliminated.

The features of the invention are specifically recited in the appended claims. A more detailed understanding of the invention can be obtained from the following detailed description of preferred embodiments of the invention taken in conjunction with the drawings.

BRIEF DESCRIPTION OF THE DRAWINGS

FIG. 1 is a schematic diagram of a prior art amplifier in the form of a bipolar transistor illustrating the inherent and stray capacitance between the base and collector terminals of the transistor.

FIG. 2 is a schematic diagram of an amplifier according to the present invention employing a single amplifying device.

FIG. 3 is a schematic diagram of another embodiment of the present invention utilizing a pair of amplifying devices connected in a push-pull configuration.

DESCRIPTION OF PREFERRED EMBODIMENT

An amplifier 22 using a single amplifying device such as a bipolar transistor 24 is illustrated in FIG. 2. An amplifier input signal is applied to an input terminal 26. A primary winding 28 of an input inductor means or transformer 30 is connected in series between the terminal 26 and reference potential 32. A secondary winding 34 of the input transformer 30 is connected in series between the base terminal of the transistor 24 and the reference potential 32. The transistor 24 is connected in an emitter follower configuration in which the collector terminal 38 is connected to a power supply 40 and the emitter terminal 42 is connected to an amplifier output signal terminal 44. A resistor 46 is connected between the emitter terminal 42 and the reference potential 32 to complete the emitter follower configuration.

The Miller effect capacitance Cm, as shown in FIG. 2, is the inherent base-to-collector capacitance Cbc shown in FIG. 1 multiplied by the gain of the transistor 24. The Miller capacitance Cm is effective between reference potential 32 and the base terminal 36, as shown by dashed lines in FIG. 2, because of the connection of the collector terminal 38 to the voltage source 40. The well-known principles of circuit analysis hold that, at signal frequency, the power supply 40 is effectively referenced to reference potential 32.

The Miller capacitance Cm is electrically effective in a parallel circuit relationship with the inductance of the secondary winding 34. A resonant circuit results and it includes the total effective inductance of the secondary winding 34 and the Miller effect capacitance Cm. This resulting resonant circuit will have a natural harmonic frequency established by the effective values of the capacitances and inductances.

As a consequence of the emitter follower or voltage follower arrangement of the transistor 24, the voltage across resistor 46 at the output terminal 44 directly and consistently follows the voltage present at the base terminal 36 from the secondary winding 34 of the transformer 30. The difference in voltage across resistor 46 as compared to the voltage across the secondary winding 34 is minimal as a result of the relatively small base-to-emitter offset voltage of the transistor 24. The offset can also be eliminated with appropriate biasing. The emitter follower or voltage follower configuration has the advantage of an extremely high input impedance to the base terminal, and this high input impedance prevents significant degradation or damping of the signal on the base terminal as a result of loading. The other advantage of the emitter follower configuration is that there is very little or no tendency for feedback between the output signal at terminal 44 and the input signal at the base terminal 36. Adverse feedback effects are thereby avoided or eliminated due to the emitter follower configuration. A further advantage is that the base current is added to the collector current at the emitter, which results in higher output current than the typical amplifier in which the base and output currents are in opposition to one another. More efficient amplification thereby results.

Preferably, the value of the Miller capacitance Cm should be coordinated with the effective inductance of the secondary winding 34 of the transformer 30 and any other discrete capacitance or inductance in the resonant circuit to create a natural harmonic frequency at a predetermined point in the frequency band at which the amplifier 22 is to be operated. The gain of the amplifier 22 is established by the ratio of the predetermined number of coil turns of the output secondary winding 34 to the predetermined number of coil turns of the input primary winding 28 multiplied by the square root of the "Q" of the resonant circuit at the predetermined operating frequency. The gain of the amplifier 22 results from the turns ratio of the input transformer, and the reactive impedance cancelling characteristics of the resonant circuit and the emitter follower amplifying device or transistor 24 maintaining the signal achieved by the resonant circuit without substantial degradation.

It is apparent that substantially larger amplifier gains than the typical previous high-frequency amplifier gain are obtained. In addition to the relatively high gain at the high signal frequencies, there is no or little tendency for the output signal to feed back and influence the input signal or otherwise degrade the amplifier performance. The Miller capacitance, previously regarded as deleterious in high-frequency amplifiers, actually creates a positive effect in conjunction with the input transformer 30 to reduce the reactive signal components, and to create a resonant circuit having greater gain capabilities due to the "Q" of the resonant circuit. The signal of the resonant circuit is substantially maintained because the emitter follower configuration presents a very high impedance when connected to the resonant circuit.

The Miller effect capacitance Cm changes with the base-to-collector voltage, somewhat like the operation of a voltage variable capacitor. In the amplifier shown in FIG. 2, the base-to-collector voltage of transistor 24 varies in accordance with the voltage from the secondary winding 34. Accordingly, the base-to-collector capacitance and hence the Miller capacitance Cm varies in magnitude and at the frequency of the signal frequency. An embodiment of an amplifier 50 of the present invention which eliminates or greatly reduces any changes in the Miller capacitance during operation of the amplifier is shown in FIG. 3.

The amplifier 50 shown in FIG. 3 operates on a push-pull principle. An input signal is applied to the terminal 52 of the primary winding 54 of an input transformer 55. The secondary winding 58 of the transformer 56 is center tapped with its center terminal or midpoint reference connected to the reference potential 58. The base terminal 60 of one transistor 62 is connected to one output terminal or end point of the secondary winding 56, and the base terminal 64 of the other transistor 66 is connected to the other output terminal or end point of the secondary winding 56. The transistors 62 and 66 are connected in an emitter follower configuration with the load of each emitter follower transistor being one half of the center tapped primary winding 68 of an output inductor means or transformer 70. The midpoint or center tap terminal of the primary winding 68 is connected to reference potential 58. The output or secondary winding 72 of the output transformer 70 is conected to an output terminal 74. The amplifier output signal is presented at terminal 74. The collector terminals of both transistor 62 and 66 are connected to the voltage or power source 76.

During the positive going portions of an input signal applied at input terminal 52, one of the transistors 62 or 66 conducts the amplified signal and that portion of the amplifier output signal is present at the secondary winding 72 of the output transformer 70. During the other or negative going portion of the input signal applied at terminal 52, the other transistor 62 or 66 conducts and applies the other portion of the amplified signal to the output transformer. The composite amplifier output signal is present at the output terminal 74.

The voltage on both collector terminals remains approximately constant, since both are connected to the same power supply 76. However, the voltages on the base terminals 60 and 64 change in unison while maintaining the same relative relationship established by the input transformer 55. Accordingly, when the collector-to-base voltage of transistor 62 changes because of the changing voltage on conductor 60 relative to the reference potential 58, the collector-to-base voltage of transistor 66 changes a corresponding opposite amount because of the tracking or unison relative movement of voltages on conductors 60 and 64. To the extent that the Miller effect capacitances of the transistors 62 and 66 are linearly related to the changes in base-to-collector voltage, the same effective Miller capacitance remains connected across the secondary winding 56 because of the corresponding opposite and hence cancelling effects of each individual Miller effect capacitance. Any variation in the "Q" of the resonant circuit created by the changing Miller capacitance is eliminated. The "Q" is maintained approximately constant for the input resonant circuit of the two transistors 62 and 66 and is not frequency or gain (voltage) dependent.

As a consequence of the present invention, the Miller effect capacitance is employed to enhance the gain or the high-frequency cut-off band width frequency, or both, in a high-frequency amplifier. This is a particularly significant accomplishment in those amplifiers employing relatively high power active amplifying devices which are subject to relatively high inherent capacitances, such as VMOS transistors.

Actual circuits constructed in accordance with the invention described herein have exhibited voltage gains in excess of one order of magnitude (ten) and power gains in excess of two orders of magnitude (one hundred). This is to be compared to prior art comparable high-frequency amplifiers which obtained a voltage gain of about seven and a power gain of less than fifty.

Bipolar transistors have been illustrated and described in the embodiments of the present invention shown in FIGS. 2 and 3. In bipolar transistors, the emitter follower configuration is an apt description for the transistor circuit connection. For field effect transistors, a source follower configuration should be used. For vacuum tubes, a voltage or cathode follower configuration should be employed. Other types of amplifying devices should employ a voltage following configuration. It is recognized that all of the different types of voltage following configurations are equivalent of one another for purposes of the present invention. Although the invention is defined in most of the appended claims in terms including a transistor having base, collector and emitter terminals, this terminology is employed for purposes of convenience of description, and other active amplifying devices which have corresponding and equivalent terminals and which have capacitances equivalent to the Miller effect capacitance are to be considered as equivalents and fall within the scope of the appended claims.

Embodiments of the present invention have been shown and described with a degree of specificity. It should be understood, however, that the specificity of this description has been made by way of preferred examples, and that the invention itself is defined by the scope of the appended claims.

What is claimed is:

1. A relatively high-frequency amplifier which employs a Miller effect capacitance to enhance gain at a relatively high predetermined signal frequency, comprising:

a transistor having an emitter terminal, a base terminal and a collector terminal, the transistor also having an inherent base-to-collector capacitance which is effectively magnified at the predetermined signal frequency as a Miller effect capacitance of an approximate value equal to the gain of the transistor multiplied by the value of the inherent base-to-collector capacitance;

input inductor means having a primary winding to which an amplifier input signal is applied and a secondary winding in which a signal is induced by the input inductor means from the application of the amplifier input signal to the primary winding, the primary winding having a predetermined number of coil turns and the secondary winding having a predetermined number of coil turns;

load means electrically connected to the emitter terminal and from which an amplifier output signal is derived;

means electrically connecting the secondary winding to the base terminal;

means electrically connected to the collector terminal of the transistor and operative in conjunction with the load means connected to the emitter terminal to place the transistor in an emitter follower configuration, the means electrically connected to the collector terminal also being electrically effective to connect the Miller effect capacitance in a resonant circuit relationship with and including the secondary winding; and wherein the gain of said amplifier is substantially established by the ratio of coil turns of the secondary winding to the coil turns of the primary winding multiplied by the square root of the "Q" of the resonant circuit including the Miller effect capacitance and the effective inductance of the secondary winding.

2. An amplifier as defined in claim 1 wherein said means electrically connected to the collector terminal comprises a power supply for said amplifier directly connected to the collector terminal of the transistor.

3. An amplifier as defined in claim 1 wherein the signal from the secondary winding is applied to the base terminal of the transistor.

4. An amplifier as defined in claim 3 wherein the secondary winding is directly connected to the base terminal of the transistor.

5. An amplifier as defined in claim 1 wherein the amplifier output signal is present at the emitter terminal of the transistor.

6. An amplifier as defined in claim 1 wherein the input inductor means comprises a transformer having the primary and secondary windings.

7. An amplifier as defined in claim 1 wherein the load means comprises an output inductor means.

8. An amplifier as defined in claim 7 wherein the output inductor means has a primary winding connected to the emitter terminal of the transistor and a secondary winding in which the amplifier output signal is induced by current in the primary winding of the output inductor means.

9. An amplifier as defined in claim 1 wherein:

the primary winding of the input inductor means extends in series between first and second primary winding terminals, the amplifier input signal is applied to the first primary winding terminal, and the second primary winding terminal is connected to an electrical reference;

the secondary winding of the input inductor means extends in series between first and second secondary winding terminals, the signal from the secondary winding is present at the first secondary winding terminal, the first secondary winding terminal is connected to the base terminal, and the second secondary winding terminal is connected to the electrical reference;

the load means is connected in series between the emitter terminal and the electrical reference; and the means electrically connected to the collector terminal comprises a power supply for said amplifier directly connected to the collector terminal of the transistor, said power supply being operative with respect to the electrical reference.

10. An amplifier as defined in claim 9 wherein the load means comprises an output inductor means having a primary winding and having a secondary winding in which signals are induced by signals in the primary winding of the output inductor means, the primary winding of the output inductor means is electrically connected in series between the emitter terminal and the reference potential, and the amplifier output signal is induced in the secondary winding of the output inductor means.

11. An amplifier as defined in claim 1 further comprising:

a second transistor in addition to the transistor first aforesaid, the second transistor having an emitter terminal, a base terminal and a collector terminal, the second transistor also having an inherent base-to-collector capacitance which is effectively magnified at the predetermined signal frequency as a Miller effect capacitance of approximate value equal to the gain of the second transistor multiplied by the value of the inherent base-to-collector capacitance; and wherein:

the secondary winding of said input inductor means is electrically connected in series between first and second output terminals thereof and is center tapped with respect to the first and second output terminals and has a center tap terminal thereof electrically connected to an electrical reference;

the first and second output terminals of the secondary winding of the input inductor means are respectively electrically connected to the base terminals of the first and second transistors;

said load means comprises an output inductor means having a primary winding and a secondary winding in which the amplifier output signal is induced by a signal in the primary winding of the output inductor means, the primary winding of the output inductor means is electrically connected in series between first and second input terminals thereof and is center tapped with respect to the first and second input terminals and has a center tap terminal thereof electrically connected to the electrical reference;

the emitter terminals of the first and second transistors are respectively connected to the first and second output terminals of the primary winding of the output inductor means;

the means electrically connected to the collector terminal is electrically connected to the collector terminals of both the first and second transistors and is operative in conjunction with the center tapped primary winding of the output inductor means connected to both the emitter terminals of the first and second transistors to place each transistor in an emitter follower configuration with respect to the electrical reference and to place both transistors in a push-pull configuration to conduct current in the primary winding of the output inductor means;

the means electrically connected to the collector terminals of the first and second transistors is also electrically effective to connect the Miller effect capacitance of both the first and second transistors in a resonant circuit relationship with and including the secondary winding of the input inductor means; and whereby any change in the Miller effect capacitance of one transistor due to a change in the voltage between the collector and base terminals of the one transistor are compensated by a corresponding opposite change in the Miller effect capacitance of the other transistor due to a corresponding opposite change in voltage between the collector and base terminals of the other transistor.

12. An amplifier as defined in claim 11 wherein said means electrically connected to the collector terminals of the first and second transistors comprises a power supply for said amplifier directly connected to the collector terminals of both the first and second transistors.

13. An amplifier as defined in claim 11 wherein the signals present at the first and second end terminals of the secondary winding of the input inductor means are respectively applied to the base terminals of the first and second transistors.

14. An amplifier as defined in claim 13 wherein the first and second end terminals of the secondary winding of the input inductor means are respectively directly connected to the base terminals of the first and second transistors.

15. An amplifier as defined in claim 11 wherein the input inductor means comprises an input transformer having the aforesaid primary and secondary windings and the output inductor means comprises an output transformer having the aforesaid primary and secondary windings as defined.

16. An amplifier as defined in claim 15 wherein the resonant frequency of the resonant circuit is approximately equal to the frequency of the predetermined high-frequency signal.

17. An amplifier as defined in claim 1 wherein the resonant frequency of the resonant circuit is approximately equal to the frequency of the predetermined high-frequency signal.

18. A relatively high-frequency amplifier which employs a Miller effect capacitance to enhance gain at a relatively high predetermined signal frequency, comprising:

an amplifying device having a control terminal, an output terminal and a power terminal, the amplifying device also having an inherent control terminal-to-power terminal capacitance which is effectively magnified at the predetermined signal frequency as a Miller effect capacitance of an approximate value equal to the gain of the amplifying device multiplied by the value of the inherent control terminal-to-power terminal capacitance;

means for directly connecting the power terminal to a power supply and to thereby effectively connect the Miller effect capacitance between the control terminal and an electrical reference of said power supply at the predetermined signal frequency;

load means connected between the output terminal of said amplifying device and the electrical reference;

said amplifying device operative in a voltage follower configuration by virtue of the direct connection of the power terminal to the power supply and the connection of the load means between the output terminal and the electrical reference;

input inductor means having a primary winding to which an amplifier input signal is applied and a secondary winding in which a signal is induced by the inductor means from the application of the amplifier input signal to the primary winding, the primary winding having a predetermined number of coil turns and the secondary winding having a predetermined number of coil turns, the secondary winding having an output terminal at which the signal induced in the secondary winding is present;

means for directly connecting the output terminal of the secondary winding to the control terminal of the amplifying device;

the Miller effect capacitance and the effective inductance of the secondary winding being included within a resonant circuit having a "Q" including the Miller effect capacitance and the effective inductance of the secondary winding; and the gain of said amplifier being primarily established by the ratio of the number of coil turns of the secondary winding to the number of coil turns of the primary winding multiplied by the square root of the "Q" of the resonant circuit.

19. An amplifier as defined in claim 18 further comprising:

a second amplifying device in addition to the amplifying device first aforesaid, the second amplifying device having a control terminal, an output terminal and a power supply terminal, the second amplifying device also having an inherent control terminal-to-power terminal capacitance which is effectively magnified at the predetermined signal frequency as a Miller effect capacitance of an approximate value equal to the gain of the amplifying device multiplied by the value of the inherent control terminal-to-power terminal capacitance; and wherein:

the secondary winding of said input inductor means is electrically connected between first and second output terminals thereof and is center tapped with respect to the first and second output terminals and has a center tap terminal thereof electrically connected to an electrical reference;

the first and second output terminals of the secondary winding of the input inductor means are respectively electrically connected to the control terminals of the first and second amplifying devices;

said load means comprises an output inductor means having a primary winding and a secondary winding in which an amplifier output signal is induced by a signal in the primary winding of the output inductor means, the primary winding of the output inductor means is electrically connected in series between the first and second input terminals thereof and is center tapped with respect to the first and second input terminals and has a center tap terminal thereof electrically connected to the electrical reference;

the output terminals of the first and second amplifying devices are respectively connected to the first and second output terminals of the primary winding of the output inductor means;

the means for directly connecting the power terminal to a power supply is electrically connected to the power terminals at both the first and second amplifying devices and is operative in conjunction with the center tapped primary winding of the output inductor means connected to both the output terminals of the first and second amplifying devices to place each amplifying device in a voltage follower configuration with respect to the electrical reference and to place both amplifiers in a push-pull configuration to conduct current in the primary winding of the output inductor means;

the means electrically connected to the power terminals of the first and second amplifying devices is also electrically effective to connect the Miller effect capacitance of both the first and second amplifying devices in a resonant circuit relationship with and including the secondary winding of the input inductor means; and whereby any change in the Miller effect capacitance of one amplifying device due to a change in the voltage between the power and control terminals of the one amplifying device are compensated by a corresponding opposite change in the Miller effect capacitance of the other amplifying device due to a corresponding opposite change in voltage between the power and control terminals of the other amplifying device.

* * * * *